US008576375B2

(12) United States Patent
Nishikawa

(10) Patent No.: US 8,576,375 B2
(45) Date of Patent: Nov. 5, 2013

(54) OPTICAL MEMBER-HOLDING APPARATUS, METHOD FOR ADJUSTING POSITION OF OPTICAL MEMBER, AND EXPOSURE APPARATUS

(75) Inventor: Jin Nishikawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 562 days.

(21) Appl. No.: 12/181,849

(22) Filed: Jul. 29, 2008

(65) Prior Publication Data

US 2008/0291416 A1    Nov. 27, 2008

Related U.S. Application Data

(63) Continuation of application No. PCT/JP2007/051377, filed on Jan. 29, 2007.

(30) Foreign Application Priority Data

Jan. 30, 2006 (JP) .................................. 2006-020576

(51) Int. Cl.
G03B 27/70 (2006.01)
G03B 27/54 (2006.01)
G02B 7/182 (2006.01)
G03F 7/20 (2006.01)

(52) U.S. Cl.
CPC ........ *G03F 7/70233* (2013.01); *G03F 7/70258* (2013.01); *G03F 7/70833* (2013.01)
USPC .............................. 355/66; 355/67; 359/872

(58) Field of Classification Search
CPC ............ G03F 7/70233; G03F 7/70258; G03F 7/70833

USPC ........... 355/49, 51, 66, 67; 359/844, 871–874
See application file for complete search history.

(56) References Cited

U.S. PATENT DOCUMENTS 5,448,332 A    9/1995  Sakakibara et al.
5,973,863 A *  10/1999 Hatasawa et al. ............. 359/823

(Continued)

FOREIGN PATENT DOCUMENTS

EP      1513021       3/2005
JP      06-283403    10/1994

(Continued)

OTHER PUBLICATIONS

International Search Report and Written Opinion mailed Apr. 24, 2007, for International Application No. PCT/JP2007/051377.

(Continued)

*Primary Examiner* — Steven H Whitesell Gordon
(74) *Attorney, Agent, or Firm* — Finnegan, Henderson, Farabow, Garrett & Dunner, L.L.P.

(57) ABSTRACT

There is provided is an optical member-holding apparatus which can hold a plurality of optical members of two different optical systems, even when the optical members exist in a common barrel in a mixed manner, such that the relative positions between the optical members can be easily adjusted; and which holds a mirror in a projection optical system and a mirror in an illumination optical system and includes a barrel unit, an inner ring holding the mirror, a holding member holding the mirror, a support plate attached to the barrel unit, and a holding-supporting mechanism attached to the support plate and adjusting the relative position of the mirror to the mirror.

27 Claims, 6 Drawing Sheets

(56) References Cited

U.S. PATENT DOCUMENTS

| | | | |
|---|---|---|---|
| 6,147,818 A * | 11/2000 | Hale et al. | 359/819 |
| 6,195,213 B1 * | 2/2001 | Omura et al. | 359/727 |
| 6,485,153 B2 | 11/2002 | Ota | |
| 6,750,949 B2 * | 6/2004 | Loopstra et al. | 355/53 |
| 6,757,051 B2 * | 6/2004 | Takahashi et al. | 355/67 |
| 7,110,089 B2 | 9/2006 | Mizuno | |
| 7,330,236 B2 | 2/2008 | Hasegawa | |
| 2002/0163741 A1 | 11/2002 | Shibazaki | |
| 2003/0234989 A1 * | 12/2003 | Oshino et al. | 359/811 |
| 2004/0189969 A1 | 9/2004 | Mizuno | |
| 2005/0140950 A1 | 6/2005 | Franken et al. | |
| 2005/0213069 A1 | 9/2005 | Murakami | |

FOREIGN PATENT DOCUMENTS

| | | |
|---|---|---|
| JP | H11-345761 | 12/1999 |
| JP | 2002-131605 | 5/2002 |
| JP | 2004-356410 A | 12/2004 |
| JP | 2005-086148 | 3/2005 |
| JP | 2005-86148 A | 3/2005 |
| JP | 2005 101593 | 4/2005 |
| JP | 2005-175177 | 6/2005 |
| JP | 2005-175177 A | 6/2005 |
| JP | 2005-276932 | 10/2005 |
| JP | 2005-276932 A | 10/2005 |
| JP | 2006-250587 A | 9/2006 |
| WO | WO 2005026801 A2 * | 3/2005 |

OTHER PUBLICATIONS

Extended European Search Report dated Sep. 20, 2011 for European Patent Application No. 07707608.1.

Japanese Office Action mailed Feb. 9, 2012, for Japanese Patent Application No. 2007-556035.

Notice of Preliminary Rejection dated Dec. 5, 2012, for Korean Patent Application No. 10-2008-7021153 (9 pages, including English translation).

* cited by examiner

OPTICAL MEMBER-HOLDING APPARATUS, METHOD FOR ADJUSTING POSITION OF OPTICAL MEMBER, AND EXPOSURE APPARATUS

CROSS-REFERENCE

This application is a Continuation Application of International Application No. PCT/JP2007/051377 which was filed on Jan. 29, 2007 claiming the conventional priority of Japanese patent Application No. 2006-020576 filed on Jan. 30, 2006.

BACKGROUND OF THE INVENTION

1. Field of the Invention

The present invention relates to an optical member-holding apparatus which holds a plurality of optical members, a position-adjusting method for adjusting positions of a plurality of optical members, an exposure apparatus in which a plurality of optical members included in an illumination optical system and a projection optical system are held by the optical member-holding apparatus, and a method for producing a device using the exposure apparatus.

2. Description of the Related Art

An exposure apparatus has been hitherto used in the lithography step for producing a semiconductor element, a liquid crystal display element, etc., wherein a pattern, which is formed on a reticle as a mask, is transferred via a projection optical system onto a substrate such as a wafer, a glass plate or the like which is coated with a resist or the like. In recent years, those mainly used as such an exposure apparatus include projection exposure apparatuses of the full field exposure system such as a stepper and of the scanning exposure type such as a scanning stepper.

In the exposure apparatus, those having been hitherto used as an exposure light beam (illumination light beam for the exposure) are the ultraviolet light beams such as the emission line (for example, the i-ray) radiated from a mercury lamp and the KrF excimer laser beam (wavelength: 248 nm). Recently, in order to obtain a higher resolution, other exposure apparatuses are also developed, which use, as the exposure light beam, the far ultraviolet light beam such as the ArF excimer laser beam (wavelength: 193 nm) and the vacuum ultraviolet light beam such as the $F_2$ laser beam (wavelength: 157 nm).

Recently, in order to produce a finer semiconductor element, etc., an EUV exposure apparatus is also developed which uses, as the exposure light beam, a light beam in the soft X-ray region having a wavelength of not more than about 100 nm, i.e., an extreme ultraviolet light beam (hereinafter referred to as "EUV (Extreme Ultraviolet) light beam"). In the case of the EUV exposure apparatus, all components of the illumination optical system and the projection optical system are constructed of reflecting optical elements or catoptric optical elements (mirrors) and a reflection type reticle is used as the reticle as well, because any optical material, through which the EUV light beam is transmitted, is absent at the present time.

Even when any one of the dioptric system, the catadioptric system, and the catoptric system is used as the projection optical system, it is necessary to adjust the image formation characteristics (various aberrations or distortions) of the projection optical system in order to transfer an image of a pattern of the reticle (reticle pattern image) onto the wafer at a high resolution. An adjusting mechanism, which adjusts the position and the posture or attitude of at least a part of the optical members constructing the projection optical system, is generally adopted as a means for this purpose. As for the adjusting mechanism for adjusting the position and the posture, a mechanism is known, which uses a lever and a mechanism for mechanically reducing the movement of the lever (see, for example, Japanese Patent Application Laid-open No. 2002-131605). A parallel link type adjusting mechanism, which adopts a parallel link mechanism, is also known as another adjusting mechanism for adjusting the position and the posture.

When the ultraviolet light beam, the far ultraviolet light beam, or the vacuum ultraviolet light beam is used as the exposure light beam as in the conventional technique, then the reticle can be subjected to the transmission illumination, and the illumination optical system and the projection optical system can be completely separated from each other. Therefore, when a holding mechanism is designed for optical members of one of the optical systems, it has been unnecessary to consider the other of the optical systems. However, in the case of the EUV exposure apparatus, all of the optical members including the reticle are reflecting members. Therefore, it is necessary that a part of optical members (mirrors) for constructing the other of the optical systems (for example, the illumination optical system) is arranged in a barrel of one of the optical systems (for example, the projection optical system). The part of the optical members is exemplified, for example, by a mirror which is included in a plurality of mirrors for constructing the illumination optical system and which is arranged closest to the side of the reticle. When a part of optical members for constructing the other of the optical systems is arranged in the barrel of one of the optical systems as described above, it is necessary that a holding mechanism is designed so that the optical members of the respective optical systems do not shield or intercept the EUV light beam as the exposure light beam, and that the relative positions can be easily adjusted in relation to the plurality of optical members.

SUMMARY OF THE INVENTION

Taking the foregoing viewpoints into consideration, an object of the present invention is to provide, even when optical members of two different optical systems are present in a mixed manner in a common barrel, an optical member-holding technique which makes it possible to hold a plurality of optical members so that the relative positions of the optical members can be easily adjusted. Another object of the present invention is to provide an exposure technique using such an optical member-holding technique.

According to the present invention, there is provided a first optical member-holding apparatus which holds a plurality of optical members in a barrel, comprising a first holding portion which holds a first optical member of the plurality of optical members; a second holding portion which holds a second optical member of the plurality of optical members; a support base which is attached to the barrel and which supports the first holding portion and the second holding portion; and an adjusting mechanism which is attached to the support base and which adjusts a relative position of the first holding portion to the second holding portion.

According to the present invention, there is provided a second optical member-holding apparatus comprising a first holding portion which holds a first optical member among a plurality of optical members constructing a first optical system; a second holding portion which holds a second optical member among a plurality of optical members constructing a second optical system different from the first optical system; a barrel which accommodates the first optical member via the first holding portion and which accommodates the second optical member via the second holding portion; and an adjusting mechanism which adjusts a relative position of the first holding portion to the second holding portion.

According to the present invention as defined above, even when the first and second optical members belong to the different optical systems, the two optical members can be arranged in the common barrel and the relative position of the first optical member to the second optical member can be easily adjusted by the adjusting mechanism.

According to the present invention, there is provided a first method for adjusting positions of a first optical member and a second optical member of a plurality of optical members, the first method comprising: providing the first optical member and the second optical member so that a relative position of each of the first optical member and the second optical member is adjustable with respect to a support base attached to a barrel; and adjusting the position of the second optical member depending on the relative position of the first optical member with respect to the support base.

According to the present invention, there is provided a second method for adjusting positions of optical members, the second method comprising: accommodating, in a barrel, a first optical member which is included in a plurality of optical members constructing a first optical system and a second optical member which is included in a plurality of optical members constructing a second optical system different from the first optical system; and adjusting a position of the second optical member after adjusting a position of the first optical member.

According to the present invention, even when the first and second optical members belong to the different optical systems, the two optical members can be arranged in the common barrel and their relative positions can be easily adjusted.

According to the present invention, there is provided a first exposure apparatus which illuminates a mask with an exposure light beam via an optical member and exposes an object with the exposure light beam via the mask and a projection optical system constructed of a plurality of optical members, the exposure apparatus further comprising the optical member-holding apparatus of the present invention, the optical member-holding apparatus holding the optical member and one optical member among the plurality of optical members.

According to the present invention, there is provided a second exposure apparatus which illuminates a mask with an exposure light beam via a first optical system constructed of a plurality of optical members and exposes an object with the exposure light beam via the mask and a second optical system constructed of a plurality of optical members, the exposure apparatus further comprising the optical member-holding apparatus of the present invention, the optical member-holding apparatus holding a first optical member among the plurality of optical members constructing the first optical system and a second optical member among the plurality of optical members constructing the second optical system.

Parenthesized reference numerals, which are affixed to the predetermined elements of the present invention as will be described below, correspond to the members depicted in the drawings to show an embodiment of the present invention. However, the respective reference numerals merely exemplify the elements of the present invention in order that the present invention is understood more easily, and thus do not limit the present invention to the components of the embodiment.

According to the present invention, even when the first and second optical members belong to the different optical systems, the optical members can be arranged in the common barrel and their relative positions can be easily adjusted. In particular, when the present invention is applied to the EUV exposure apparatus, for example an optical member of the illumination optical system and an optical member of the projection optical system can be arranged in the same barrel in such a state that the relative positions of the optical members can be easily adjusted.

DESCRIPTION OF THE PREFERRED
EMBODIMENTS OF THE INVENTION

An embodiment of the present invention will be explained below with reference to the drawings as an example. In this embodiment, the present invention is applied to a EUV exposure apparatus which uses the extreme ultraviolet light beam, i.e., the EUV (Extreme Ultraviolet) light beam as the exposure light beam.

Figure 1:
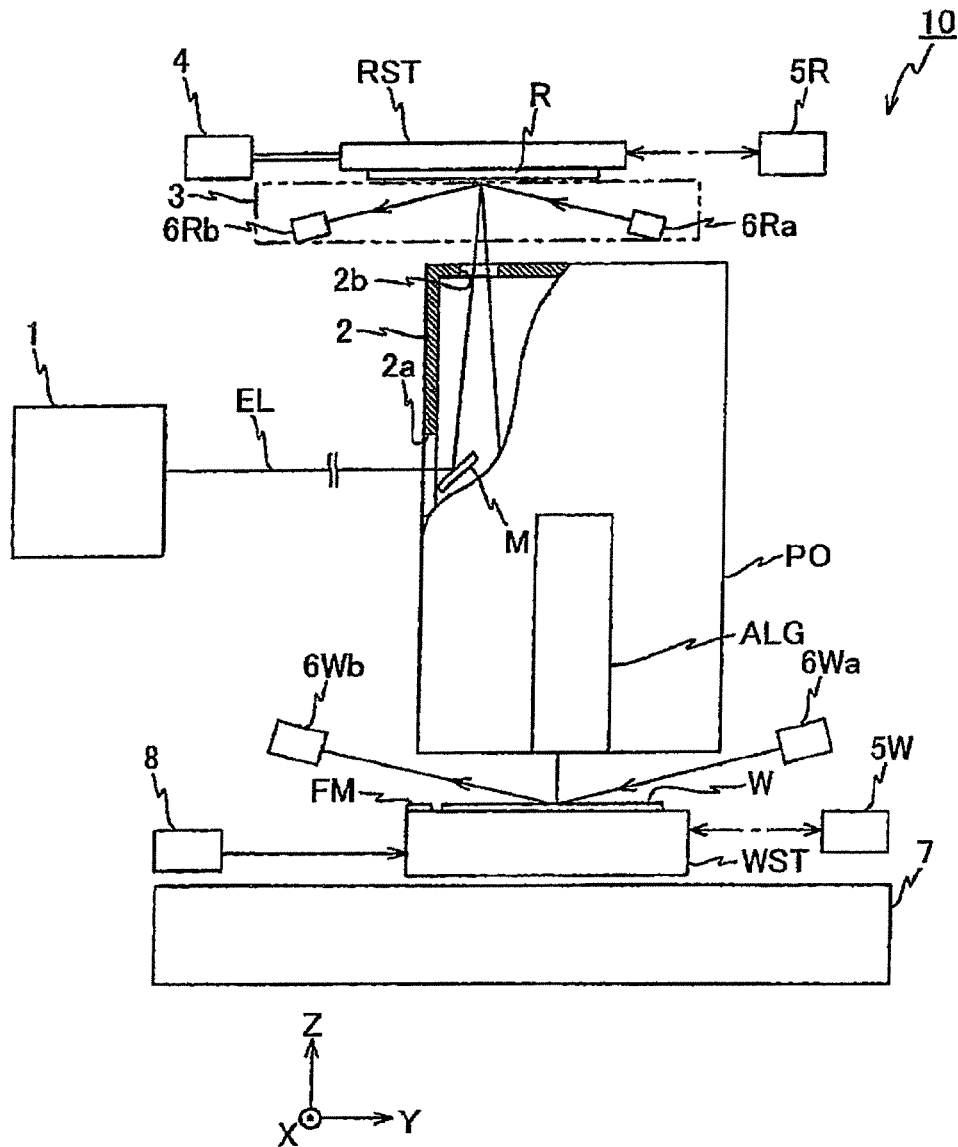
FIG. 1 shows, with partial cutout, a schematic arrangement view of an exemplary exposure apparatus of an embodiment of the present invention.

FIG. 1 schematically shows an overall construction of an exposure apparatus 10 of this embodiment. A projection optical system PO is used in this exposure apparatus 10 as described later on. Therefore, the following explanation will be made assuming that a Z axis extends in parallel to the optical axis of the projection optical system PO, an Y axis extends in the left-right direction in the sheet surface of FIG. 1 in a plane perpendicular to the Z axis, and an X axis extends in a direction perpendicular to the sheet surface. The exposure apparatus 10 is operated such that an image of a part of a circuit pattern formed on a reticle R as a mask is projected onto a wafer W as an object via the projection optical system PO, while the reticle R and the wafer W are relatively scanned in the one-dimensional direction (Y direction in this embodiment) with respect to the projection optical system PO. By the relative scanning, the entire circuit pattern of the reticle R is transferred to each of a plurality of shot areas on the wafer W in the step-and-scan manner.

The exposure apparatus 10 includes, for example, a light source unit 1 which radiates a light beam in the soft X-ray region, i.e., an extreme ultraviolet light beam (EUV light) having a wavelength of not more than about 100 nm as the illumination light beam EL (exposure light beam) for the exposure; an illumination optical system including an optical path-bending mirror M which reflects the illumination light beam EL radiated from the light source unit 1 so that the illumination light beam EL comes into a pattern surface (lower surface) of the reticle R at a predetermined angle of incidence, for example, about 50 mrad; a reticle stage RST which holds the reticle R; the projection optical system PO which projects the illumination light beam EL reflected by the pattern surface of the reticle R perpendicularly onto an exposure objective surface (upper surface) of the wafer W; and a wafer stage WST which holds the wafer W. The mirror M is formed of a plane mirror, and is arranged in a barrel 2 of the projection optical system PO. However, the mirror M is actually one of a plurality of optical members constructing illumination optical system. As the light source unit 1, for example, a laser-excited plasma light source is used. As an example of the illumination light beam EL, a EUV light beam having a wavelength of 5 to 20 nm, for example, a wavelength of 11 nm is mainly used. Since the EUV light beam cannot be transmitted through the air (the energy of the EUV light beam is attenuated in the air), the exposure apparatus 10 is accommodated in a vacuum chamber (not shown).

The illumination optical system is constructed to include, for example, a plurality of optical members, i.e., illumination mirrors for the illumination, a wavelength selection window, and the like (any one of them is not shown) as well as the mirror M. A paraboloid mirror, which serves as a light-collecting mirror, is arranged in the light source unit 1. The paraboloid mirror may be also regarded as a part of the optical members constructing the illumination optical system. The mirror M is arranged closest to the side of the reticle R among the plurality of other illumination mirrors constructing the illumination optical system. The illumination light beam EL, which is radiated from the light source unit 1 and which passes via the illumination mirrors included in the illumination optical system, is reflected by the mirror M toward the reticle R so that a partial area of the pattern of the reticle R is illuminated with the illumination light beam EL in a form of a circular arc-shaped slit.

The reticle stage RST is arranged on a reticle base 3 which is arranged in the XY plane. The reticle stage RST is supported in a non-contact state over the reticle base 3 by the magnetic floating force generated, for example, by a magnetic floating type two-dimensional linear actuator which constitutes a driving unit 4. The reticle stage RST is driven by a predetermined stroke in the Y direction by the driving force generated by the driving unit 4. Further, the reticle stage RST is driven in minute amounts in the X direction and in the $\theta z$ direction (direction of rotation about the Z axis) as well. Further, it is possible to drive the reticle stage RST also in minute amounts in the Z direction, the direction of rotation about the X axis ($\theta x$ direction), and the direction of rotation about the Y axis ($\theta y$ direction) by adjusting the magnetic floating forces generated by the driving unit 4 at a plurality of places.

An unillustrated reticle holder of an electrostatic chuck system (or a mechanical chuck system) is provided on the side of the lower surface of the reticle stage RST. The reticle R is held by the reticle holder by the attraction or suction. A reflection type reticle is used as the reticle R, because the illumination light beam EL is the EUV light beam. The reticle R is formed of a thin plate-shaped member made of silicon wafer, silica glass, low expansion glass, or the like. A reflective film, which reflects the EUV light beam, is formed on the pattern surface of the reticle R. The reflective film is a multilayer film including about 50 pairs of films of molybdenum Mo and beryllium Be which are stacked alternately at a cycle or period of about 5.5 nm. The multilayer film has a reflectance of about 70% with respect to the EUV light beam having a wavelength of 11 nm. Multilayer films, which are constructed in the same manner as described above, are formed also on the reflection surfaces of the mirror M and the other respective mirrors included in the illumination optical system and the projection optical system PO. The entire surface of the multilayer film formed on the pattern surface of the reticle R is coated with, for example, nickel Ni or aluminum Al to serve as an absorbing layer. The absorbing layer is subjected to the patterning to form a circuit pattern which serves as a reflection or reflective portion. The EUV light beam (illumination light beam EL), which is reflected by the circuit pattern, is directed toward the projection optical system PO.

The position (X, Y, $\theta z$) of the reticle stage RST (reticle R) in the XY plane is always detected, for example, at a resolution of about 0.5 to 1 nm by a laser interferometer (hereinafter referred to as "reticle interferometer") 5R which projects a laser beam onto a reflection surface provided (or formed) on the reticle stage RST. On the other hand, the position of the reticle R in the Z direction and the angle of inclination ($\theta x$, $\theta y$) with respect to the XY plane are measured by a focus sensor constructed by a light-feeding system 6Ra which radiates a detection light beam onto the pattern surface in an oblique direction and a light-receiving system 6Rb which receives the detection light beam reflected by the pattern surface. A multi-focus point position-detecting system, which is disclosed, for example, in Japanese Patent Application Laid-open No. 6-283403 (corresponding to U.S. Pat. No. 5,448,332), etc., is used as the focus sensor. Measured values of the reticle interferometer 5R and the focus sensor (6Ra, 6Rb) are supplied to a main controller (not shown). Based on the measured values, the main controller drives the reticle stage RST (reticle R) in six degrees of freedom via the driving unit 4.

A catoptric system, which has a numerical aperture NA of, for example, 0.1 and which is constructed only of reflecting optical elements (mirrors), is used for the projection optical system PO. In this embodiment, the projection magnification is ¼-fold. Openings 2a, 2b are formed through the barrel 2 of the projection optical system PO in order that the illumination light beam EL coming into the mirror M and the illumination light beam EL coming into the reticle R to be reflected are allowed to pass through the openings 2a and 2b, respectively. An opening (not shown) is also formed in order that the illumination light beam EL coming into the wafer W from the projection optical system PO is allowed to pass through the opening. The illumination light beam EL reflected by the reticle R is projected onto the wafer W via the projection optical system PO. With this, the pattern on the reticle R is reduced to ¼, and the pattern is transferred to the wafer W.

The wafer stage WST is arranged on a wafer base 7 which is arranged in the XY plane. The wafer stage WST is supported in a non-contact state over the wafer base 7 by a driving unit 8 constructed of, for example, a magnetic floating type two-dimensional linear actuator. The wafer stage WST is driven by a predetermined stroke of, for example, 300 to 400 mm in the X direction and in the Y direction by the driving unit 8. The wafer stage WST is driven in a minute amount in the $\theta z$ direction as well. Further, the wafer stage WST can be also driven in minute amounts in the Z direction and the direction of inclination with respect to the XY plane by the driving unit 8.

An unillustrated wafer holder of the electrostatic chuck system is provided on the upper surface of the wafer stage WST. The wafer W is held by the wafer holder by attraction.

The positions of the wafer stage WST in the X direction and the Y direction and the angles of inclination θx, θy, θz about the X axis, the Y axis, and the Z axis are always detected, for example, at a resolution of about 0.5 to 1 nm by a laser interferometer (hereinafter referred to as "wafer interferometer") 5W which is arranged at the outside of the wafer stage WST. On the other hand, the position of the wafer W in the Z direction and the angle of inclination (θx, θy) with respect to the XY plane, with the barrel 2 of the projection optical system PO as a reference, are measured by a focus sensor constructed by a light-feeding system 6Wa which radiates a detection light beam onto an exposure objective surface of the wafer in an oblique direction and a light-receiving system 6Wb which receives the detection light beam reflected by the exposure objective surface. The focus sensor is a multi-focus point position-detecting system which is similar to the focus sensor (6Ra, 6Rb) for the reticle R. Measured values of the wafer interferometer 5W and the focus sensor (6Wa, 6Wb) are supplied to the unillustrated main controller. The main controller drives the wafer stage WST (wafer W) in six degrees of freedom, via the driving unit 8, based on the measured values of the wafer interferometer 5W and the focus sensor (6Wa, 6Wb) and the measured value of the position of the reticle stage RST.

Further, in this embodiment, as shown in FIG. 1, an alignment system ALG provided to measure the position of the alignment mark on the wafer W is fixed to the barrel 2 of the projection optical system PO. Those usable as the alignment system ALG include a sensor of the image processing system such as the so-called FIA (Field Image Alignment) system, a scanning type probe microscope such as AFM (atomic force microscope), etc. A spatial image-measuring portion FM is provided at one end of the upper surface of the wafer stage WST in order to perform a measurement (so-called the baseline measurement) of the relative positional relationship between the alignment system ALG and the position of the projection image of the pattern formed on the reticle R, etc.

Figure 2:
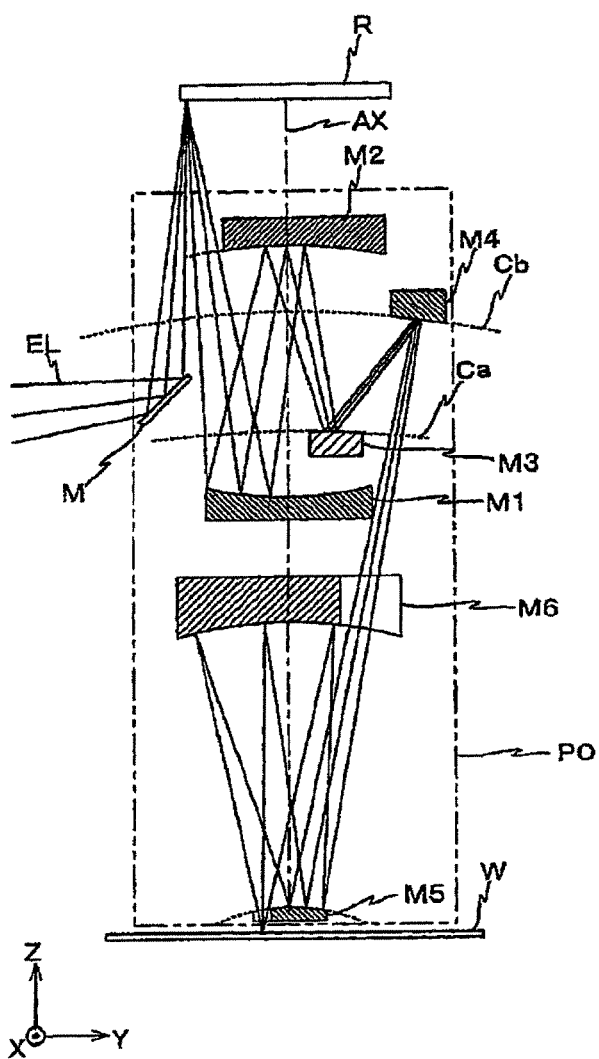
FIG. 2 is a sectional view of the optical path for an illumination light beam in a projection optical system PO shown in FIG. 1.

An explanation will be made in detail below about the projection optical system PO and the optical path-bending mirror M for bending the optical path in the illumination optical system. FIG. 2 shows the arrangement of the mirror M and six mirrors M1 to M6 as a plurality of optical members constructing the projection optical system PO. With reference to FIG. 2, those arranged in an area from the reticle R to the wafer W are the mirror M2 which has a reflection surface directed in the downward direction (−Z direction), the mirror M4 which has a reflection surface directed in the downward direction, the mirror M3 which has a reflection surface directed in the upward direction (+Z direction), the mirror M1 which has a reflection surface directed in the upward direction, the mirror M6 which has a reflection surface directed in the downward direction, and the mirror M5 which has a reflection surface directed in the upward direction. The mirror M, which is a part of the illumination optical system, is arranged between two planes Ca, Cb which are substantially defined by extending the reflection surfaces of the mirrors M3, M4. Each of the reflection surfaces of the mirrors M1 to M6 has a spherical surface or an aspherical surface. Further, the planes, which are defined by extending the reflection surfaces of the mirrors M1 to M6, are planes in rotational symmetry and are positionally adjusted so that the axis of rotational symmetry is substantially coincident with the optical axis AX of the projection optical system PO. The mirrors M1, M2, M4, and M6 are concave mirrors, and the remaining mirrors M3, M5 are convex mirrors. Each of the reflection surfaces of the mirrors M1 to M6 is processed at such a processing accuracy that the irregularity is not more than about 1/50 to 1/60 of the exposure wavelength with respect to the designed value. Only a flatness error of not more than 0.2 nm to 0.3 nm remains as represented by the RMS value (standard deviation). The shape of the reflection surface of each of the mirrors is formed by alternately repeating measurement and processing.

In the construction shown in FIG. 2, the illumination light beam EL reflected upwardly by the mirror M is reflected downwardly by the reticle R, and then the illumination light beam EL is reflected upwardly by the mirror M1. Subsequently, the illumination light beam EL is reflected downwardly by the mirror M2, followed by being reflected upwardly by the mirror M3 and reflected downwardly by the mirror M4. The illumination light beam EL reflected upwardly by the mirror M5 is reflected downwardly by the mirror M6 to form the image of the pattern of the reticle R on the wafer W.

Figure 3:
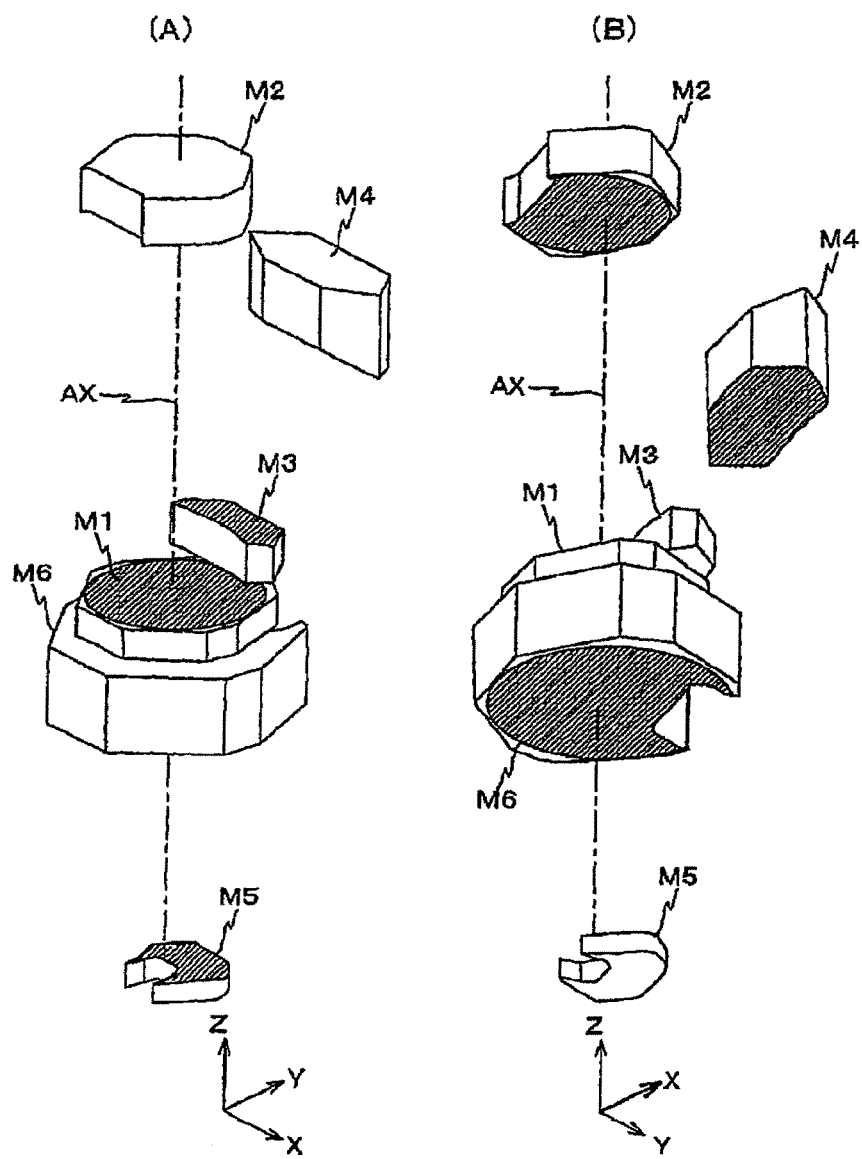
FIG. 3A is a perspective view of a plurality of mirrors constructing the projection optical system PO as seen from an obliquely upward position.
FIG. 3B is a perspective view of the plurality of mirrors as seen from an obliquely downward position.

FIG. 3A shows a perspective view of the six mirrors M1 to M6 as seen from an obliquely upward position, and FIG. 3B shows a perspective view of the six mirrors M1 to M6 as seen from an obliquely downward position. In FIGS. 3A and 3B, the reflection surfaces of the respective mirrors are hatched. As appreciated from the drawings, each of the mirrors M1 to M6 is processed to have such a shape so as not to shield or intercept the illumination light beam EL.

Figure 4:
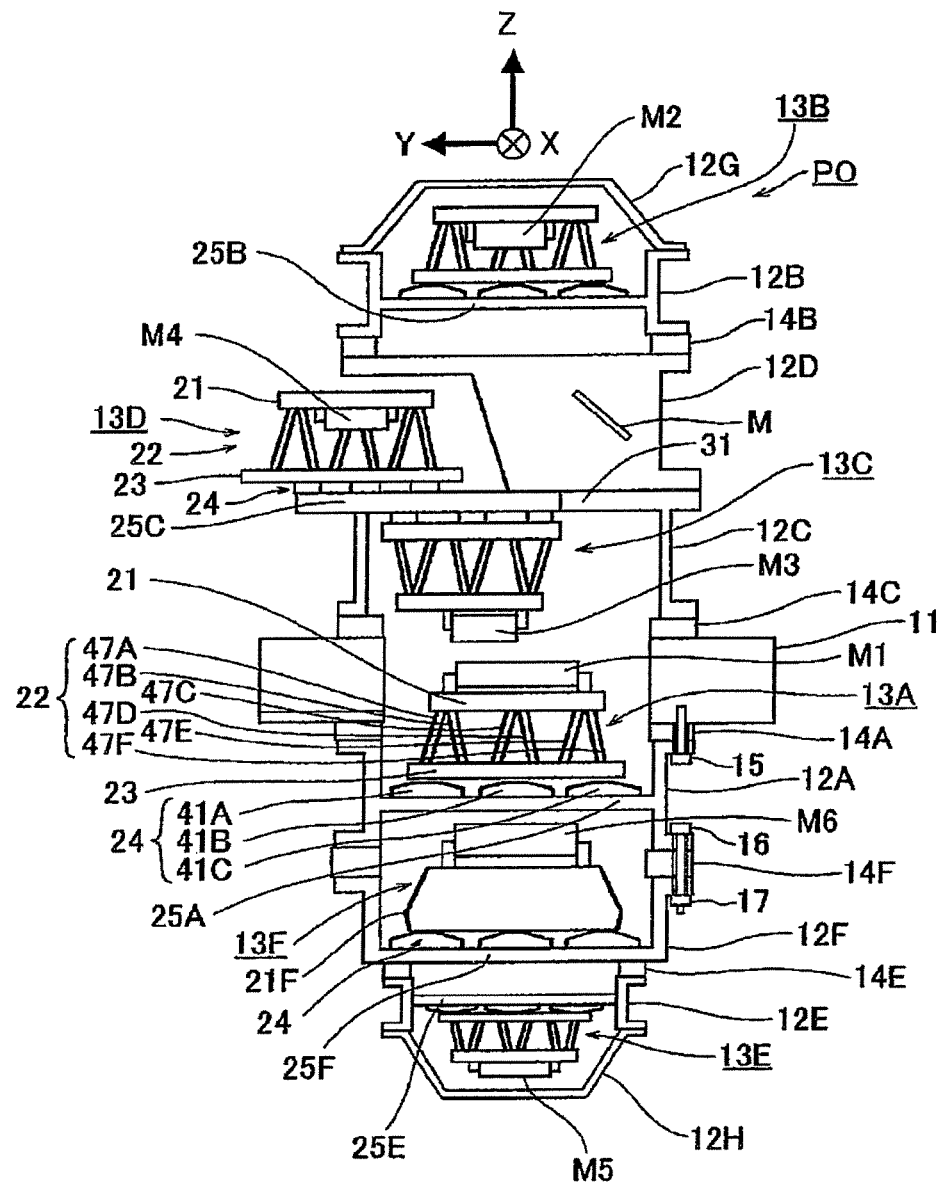
FIG. 4 is a sectional view of holding-adjusting mechanisms for the mirrors and the barrel of the projection optical system PO shown in FIG. 1.

FIG. 4 shows the barrel of the projection optical system PO and holding-adjusting mechanisms for the mirrors M1 to M6 and M. The projection optical system PO has the barrel which holds the mirrors M1 to M6. The barrel has a plurality of cylindrical barrel units 12A, 12B, 12C, 12D, 12E, 12F which hold the mirrors M1, M2, M3, M4, M5, M6 respectively. With reference to FIG. 4, the mirrors M1, M2, M3, M4, M5, M6 are held or retained by the holding-adjusting mechanisms 13A, 13B, 13C, 13D, 13E, 13F in the barrel units 12A, 12B, 12C, 12D, 12E, 12F respectively so that the mirrors M1, M2, M3, M4, M5, M6 are movable (drivable), with respect to an unillustrated column, etc., in six degree of freedom in relation to the angles of rotation about the X axis, the Y axis, and the Z axis and the positions in the X direction, the Y direction, and the Z direction. Only the barrel unit 12D has a side surface in the +Y direction which is cut out in order to arrange the mirror M4 therein. The mirror M of the illumination optical system is arranged at the inside of the barrel unit 12D in the −Y direction. Ring-shaped support plates 25A, 25B, 25E, 25F are fixed in the barrel units 12A, 12B, 12E, 12F respectively. The holding-adjusting mechanisms 13A, 13B, 13F are fixed on the support plates 25A, 25B, 25F respectively. The holding-adjusting mechanism 13E is fixed on the bottom surface of the support plate 25E.

Figure 5:
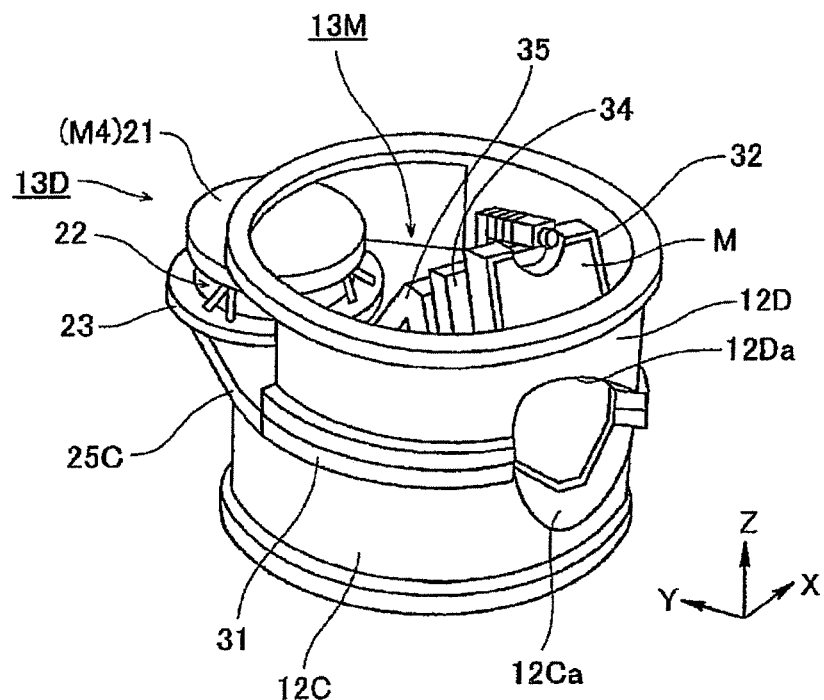
FIG. 5 is a perspective view of barrel units 12C and 12D shown in FIG. 4.

FIG. 5 shows the barrel units 12C, 12D (barrel) shown in FIG. 4. With reference to FIG. 5, semicircular disk-shaped support plates 31, 25C (support base), each of which has an opening formed to allow the illumination light beam EL to pass therethrough, are fixed on the side in the −Y direction and the side in the +Y direction of the upper surface of the barrel unit 12C respectively. An inner ring 21 (second holding portion), which holds the mirror M4 (second optical member), is supported on the support plate 25C via the holding-adjusting mechanism 13D (second adjusting mechanism). The mirror M (first optical member), which is accommodated in the holding member 32 (first holding portion), is supported on the support plate 31 via the holding-adjusting mechanism 13M (first adjusting mechanism). The holding-adjusting mechanisms 13D and 13M as a whole are used as the adjusting mechanism for adjusting the relative positions of the mirror M4 and the mirror M. Openings 12Ca, 12Da, through which the illumination light beam EL passes, are formed at portions of the side surfaces of the barrel units 12C, 12D in the −Y direction, i.e., at the portions opposite to or facing the reflection surface of the mirror M. The holding-adjusting mechanism 13M can be also adjusted through the openings 12Ca, 12Da.

With reference to FIG. 4 again, the holding-adjusting mechanism 13C is fixed to the bottom surface of the support plate 25C. A large-sized ring-shaped flange 11 is fixed to the unillustrated column. The barrel unit 12A is fixed to the bottom surface of the flange 11 by a bolt 15 via a washer 14A. The barrel unit 12F is fixed to the bottom surface of the barrel unit 12A by a bolt 16 and a nut 17 via a washer 14F. The barrel unit 12E is fixed to the bottom surface of the barrel unit 12F by a bolt (not shown) via a washer 14E. Further, the barrel unit 12H, which has an opening formed to allow the illumination light beam to pass therethrough, is fixed to the lower surface of the barrel unit 12E so that the mirror M5 in the barrel unit 12E is covered with the barrel unit 12H.

The barrel unit 12C is fixed to the upper surface of the flange 11 by a bolt (not shown) via a washer 14C. The barrel unit 12D is fixed to the upper surface of the barrel unit 12C by a bolt (not shown). The barrel unit 12B is fixed to the upper surface of the barrel unit 12D by a bolt and a nut (not shown) via a washer 14B. The barrel unit 12G, which has an opening to allow the illumination light beam to pass therethrough, is fixed to the upper surface of the barrel unit 12B so that the mirror M2 in the barrel unit 12B is covered with the barrel unit 12G. In this embodiment, the barrel 2 of the projection optical system PO shown in FIG. 1 is constructed of the flange 11, the barrel units 12A to 12H, the washers 14A to 14F, the bolts and nuts for fixing these components, etc. The barrel units 12A to 12H and the flange 11 are formed of a material such as stainless steel which causes less degassing.

The holding-adjusting mechanisms 13A to 13E, which are included in the holding-adjusting mechanisms 13A to 13F described above, are basically constructed in the same manner, although the holding-adjusting mechanisms 13A to 13E have different sizes. Therefore, an explanation will be made about the arrangement of the holding-adjusting mechanism 13A among the holding-adjusting mechanisms 13A to 13E. That is, the barrel unit 12A is fixed to the bottom surface of the flange 11 via the washer 14A, and the mirror M1 is held or retained on the support plate 25A inside the barrel unit 12A via the holding-adjusting mechanism 13A. The holding-adjusting mechanism 13A includes an inner ring 21 (holding portion) which holds the mirror M1; an outer ring 23 which is arranged to be away from the inner ring 21 in the Z direction; a parallel link mechanism 22 which actively performs fine adjustment of the relative positions of the inner ring 21 in six degrees of freedom including the positions of the inner ring 21 in the X direction, the Y direction, and the Z direction and the angles about the X axis, the Y axis, and the Z axis with respect to the outer ring 23; and a lever system adjusting mechanism 24 of the semi-fixed type which adjusts the relative positions of the outer ring 23 in six degrees of freedom including the positions of the outer ring 23 in the X direction, the Y direction, and the Z direction and the angles about the X axis, the Y axis, and the Z axis with respect to the support plate 25A. The parallel link mechanism 22 is provided with six rod-shaped links 47A, 47B, 47C, 47D, 47E, 47F for each of which the amount of expansion/contraction can be independently controlled by a driving element including, for example, a piezoelectric element. The lever system adjusting mechanism 24 is provided with three driving portions 41A, 41B, 41C each of which uses the leverage principle and is capable of controlling the displacement, of the optical member as the holding objective, in two degrees of freedom of the optical axis direction and the circumferential direction of the optical member, as disclosed, for example, in Japanese Patent Application Laid-open No. 2002-131605.

By adjusting the thickness of the washer 14A, it is possible to control the position of the barrel unit 12A with respect to the unillustrated column, and consequently the position of the inner ring 21 holding the mirror M1 in the Z direction (optical axis direction of the mirror M1). It is also possible to adjust the position of the barrel unit 12A in the X direction and the Y direction with respect to the unillustrated column with an unillustrated adjusting jig by utilizing the fact that the diameter of the hole for the bolt provided for the barrel unit 12A is larger to some extent than the diameter of the bolt 15. Such adjustment can be also performed in a same or similar manner for the other holding-adjusting mechanisms 13B to 13E including the holding-adjusting mechanism 13D for the mirror M4. However, the washer 14C is used commonly in relation to the holding-adjusting mechanisms 13C, 13D.

On the other hand, the holding-adjusting mechanism 13F includes a cylindrical holding member 21F which holds the mirror M6; and a lever system adjusting mechanism 24 which drives the holding member 21F (mirror M6) with respect to the support plate 25F. That is, in the holding-adjusting mechanism 13F, the parallel link mechanism 22 is omitted, as compared with the holding-adjusting mechanism 13A. It goes without saying that the two types of the adjusting mechanisms may be provided for the mirror M6 in the same manner as the holding-adjusting mechanism 13A. At least one mirror of the mirrors M1 to M6 may be held by a holding-adjusting mechanism which is same as or similar to the holding-adjusting mechanism 13A, and the remaining mirrors may be held by holding-adjusting mechanisms which are same as or similar to the holding-adjusting mechanism 13F.

An explanation will be made in detail below with reference to FIGS. 6 to 8 about the construction of the holding-adjusting mechanism 13M for the mirror M shown in FIG. 5.

Figure 6:
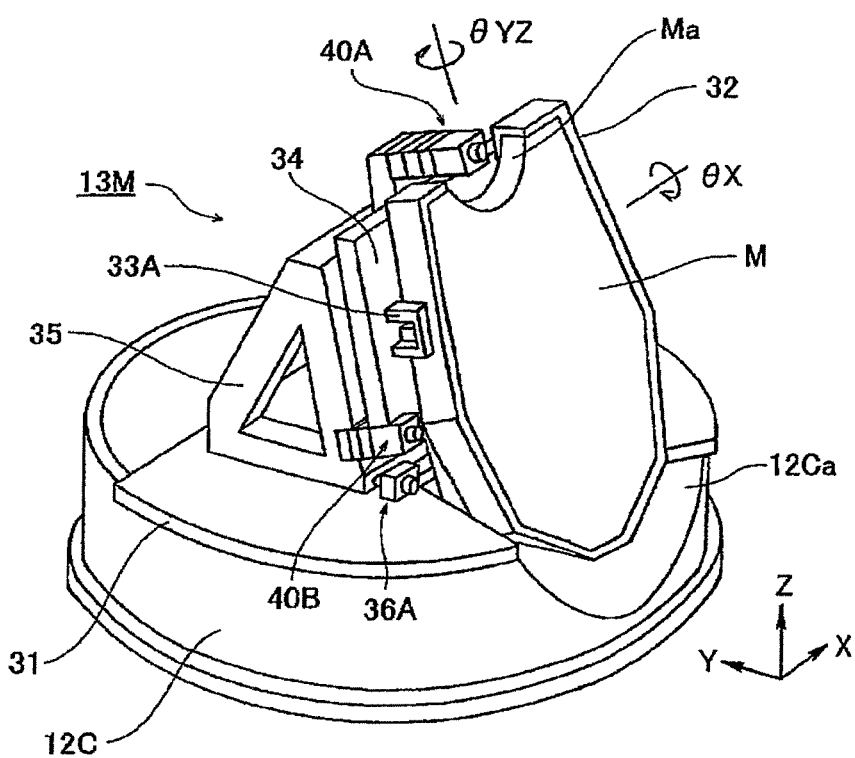
FIG. 6 is a perspective view illustrating a state that the upper barrel unit 12D and a support plate 25C are detached from the construction shown in FIG. 5.

FIG. 6 is a perspective view illustrating a state that the upper barrel unit 12D and the support plate 25C are detached from the construction shown in FIG. 5. FIG. 7 is a side view illustrating those shown in FIG. 6 as seen from a side of the illumination optical system (in the −Y direction). As shown in FIG. 6, the support plate 31 is fixed to the upper surface of the barrel unit 12C. The upper surface of the support plate 31 is substantially parallel to the XY plane. A slide member 35, in which both side surfaces in the X direction are formed in triangular frame-shaped forms, is placed on the upper surface of the support plate 31 so that the slide member 35 is movable in the Y direction along a guide member 36 (see FIG. 8). A flat plate-shaped driving plate 34 is arranged on an inclined surface of the slide member 35 in the −Y direction with a predetermined variable spacing distance from the inclined surface. A holding member 32, which accommodates the mirror M, is fixed to the upper surface of the driving plate 34 in the −Y direction at two fixing portions 33A, 33B in the X direction (see FIG. 7) and a fixing portion in the −Z direction (not shown).

A semicircular cutout Ma, which is provided to allow the illumination light beam EL reflected by the reticle to pass therethrough toward the side of the mirror M1 (see FIG. 2) disposed downwardly, is formed at an upper portion of the mirror M of this embodiment. An opening, which is provided to allow the illumination light beam EL to pass therethrough, is also formed in each of the driving plate 34, the slide member 35, and the support plate 31.

With reference to FIG. 6, the driving plate 34 is driven in the normal line direction with respect to the inclined surface of the slide member 35 at the driving mechanism 40A which is disposed at one upper position and the driving mechanisms 40B, 40C (see FIG. 7) which are arranged at two lower positions while being away from each other by a predetermined spacing distance. In this case, by making the driving amounts of the driving mechanisms 40B, 40C (second adjusting portion) disposed at the two lower positions to be different, it is possible to incline the holding member 32 (mirror M) by an angle θYZ about a first axis disposed in the YZ plane and parallel to the reflection surface (optical surface) of the mirror M. Further, by making the driving amounts of the driving mechanisms 40B, 40C disposed at the two lower positions to be equal to each other by using the driving mechanisms 40A to 40C (third adjusting portion) and by making the driving amount of the driving mechanism 40A disposed at the one upper position to be different with respect to the driving amounts of the driving mechanism 40B and 40C, it is possible to incline the holding member 32 (mirror M) by an angle θX about a second axis (axis perpendicular to the first axis described above) which is parallel to the X axis and is parallel to the reflection surface of the mirror M.

Figure 7:
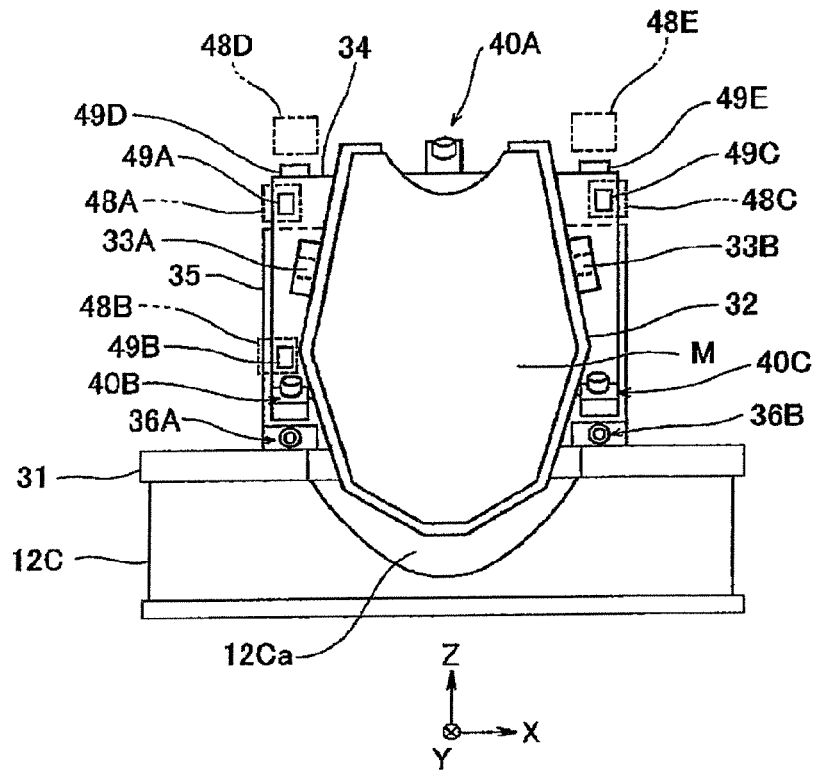
FIG. 7 is a side view of those shown in FIG. 6 as viewed from a side of the illumination optical system (in the −Y direction).

As shown in FIG. 7, the slide member 35 and consequently the holding member 32 (mirror M) are driven in the Y direction, i.e., in the radial direction from the center of the barrel unit 12C by the Y axis driving mechanisms 36A, 36B (first adjusting portion) provided at the two positions with a predetermined spacing distance in the X direction on the support plate 31. Further, by making the driving amounts of the driving mechanisms 40A to 40C disposed at the three positions to be equal to one another to drive the slide member 35 and consequently the holding member 32 (mirror M) as well in the Y direction by the Y axis driving mechanisms 36A, 36B so that the displacement of the holding member 32 (mirror M) in the Y direction is offset in this situation, it is also possible to drive the mirror M only in the Z direction. The holding-adjusting mechanism 13M is constructed to include the slide member 35, the driving plate 34, the Y axis driving mechanisms 36A, 36B, and the driving mechanisms 40A to 40C as described above to thereby adjust the positions of the holding member 32 and the mirror M in the Y direction and the Z direction and the angles θYZ and θX. The displacement of the mirror M in the plane parallel to the reflection surface of the mirror M, i.e., the displacement of the mirror M in the X direction and in the direction of rotation about the normal line of the reflection surface exerts no influence on the optical path for the illumination light beam EL to be reflected by the reflection surface. Accordingly, in this embodiment, any mechanism for driving the mirror M in the X direction and in the direction of rotation about the normal line of the reflection surface is not provided.

In this construction, by detaching or removing the Y axis driving mechanisms 36A, 36B disposed at the two positions and by moving the slide member 35 in the −Y direction, it is possible to easily detach the holding-adjusting mechanism 13M and the holding member 32 (mirror M) integrally from the barrel unit 12C. By performing an operation reverse to the detaching operation, it is possible to easily incorporate the holding-adjusting mechanism 13M and the holding member 32 (mirror M), assembled at the outside, integrally onto the support plate 31 of the barrel unit 12C. In this situation, the holding member 32 and the barrel unit 12C do not mechanically interfere with each other because the opening 12Ca is provided for the barrel unit 12C.

The two Y axis driving mechanisms 36A, 36B of this embodiment are constructed identically, and the three driving mechanisms 40A to 40C are constructed similarly. Therefore, an explanation will be made with reference to FIG. 8 about the arrangement of one Y axis driving mechanism 36A and one driving mechanism 40A.

Figure 8:
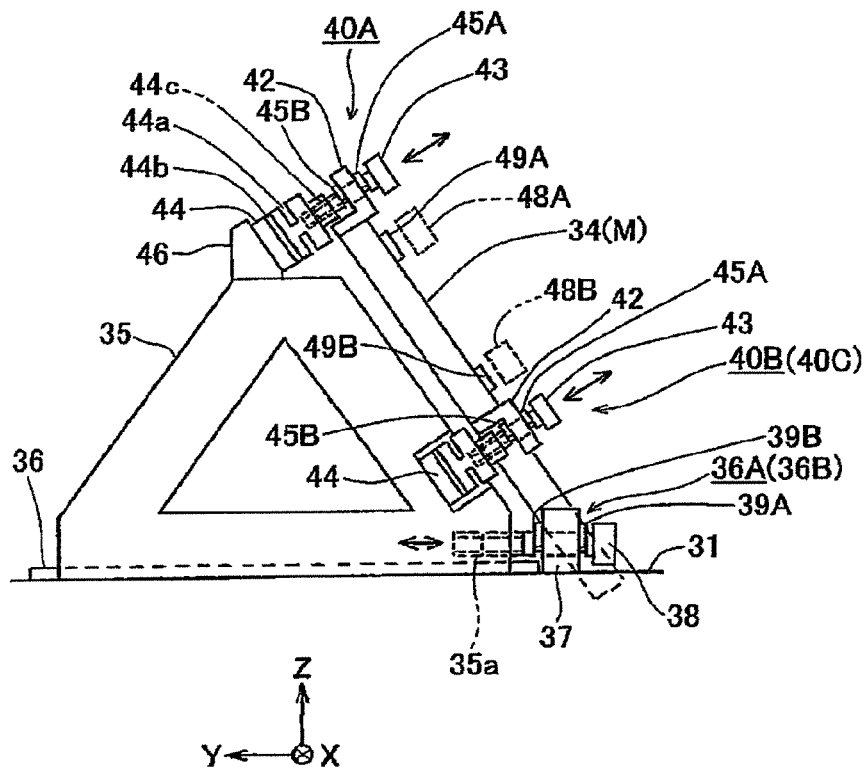
FIG. 8 is a side view of a slide member 35 and a driving plate 34 shown in FIG. 6, as seen in the −X direction.

FIG. 8 is a side view of the slide member 35 and the driving plate 34 shown in FIG. 6 as seen in the −X direction. With reference to FIG. 8, the Y axis driving mechanism 36A includes a fixed member 37 which is fixed on the support plate 31; a bolt 38 which is screw-engaged with a screw portion 35a provided at an end of the slide member 35 along the Y axis and penetrating through a through-hole of the fixed member 37; and a pair of E-rings 39A, 39B which are provided to fix the bolt 38 relative to the fixed member 37. The E-rings 39A, 39B are attached to grooves provided on the shaft of the bolt 38 so that the fixed member 37 is interposed therebetween. In this construction, by rotating the bolt 38, it is possible to drive the slide member 35 and the holding member 32 (mirror M) in the +Y direction or the −Y direction with respect to the fixed member 37. The bolt 38 may be manually operated by an operator, or the bolt 38 may be automatically operated with a motor.

On the other hand, the driving mechanism 40A includes a fixed member 42 which is fixed to an end on the upper side of the driving plate 34; a bolt 43 which is arranged to penetrate through a through-hole of the fixed member 42; a pair of E-rings 45A, 45B which are provided to fix the bolt 43 relative to the fixed member 42; an attachment member 46 which is fixed to an upper portion of the slide member 35; and a flexure member 44 (elastic member) which is fixed to a surface of the attachment member 46 opposite to or facing the fixed member 42 and which is formed with a screw portion 44c to be screw-engaged with the bolt 43. The E-rings 45A, 45B are attached to grooves provided on the shaft of the bolt 43 so that the tip portion of the fixed member 42 is interposed therebetween. The flexure member 44 has grooves 44a, 44b which are formed at two positions in directions perpendicular to each other. Therefore, any unnecessary stress is not allowed to act on the driving plate 34 when the driving mechanism 40A is driven. By operating the bolt 43 in this construction, it is possible to drive the driving plate 43 (consequently the mirror M as well) in the direction perpendicular to the inclined surface of the slide member 35, via the fixed member 42, with respect to the slide member 35. The other driving mechanisms 40B, 40C disposed downwardly are constructed in the same manner as the driving mechanism 40A. However, the driving mechanisms 40B, 40C are different from the driving mechanism 40A in that the flexure member 44 of each of the driving mechanisms 40B, 40C is attached to a recess provided on the inclined surface of the slide member 35. The bolt 43 may be manually operated by an operator, or the bolt 43 may be automatically operated with a motor, in the same manner as the bolt 38. In this case, the adjustment can be easily performed from the outside, because the rotary portions of the bolts 38 of the Y axis driving mechanisms 36A, 36B and the bolts 43 of the driving mechanisms 40A to 40C of this embodiment are directed outwardly in the radial direction of the barrel unit 12C.

Further, capacitance type sensors are provided to detect the driving amount of the mirror M. As shown in FIGS. 7 and 8, the capacitance sensors are provided with detection-objective portions 49A, 49B, 49C, 49D, 49E which are fixed to the driving plate 34, and detecting portions 48A, 48B, 48C, 48D, 48E which are arranged opposite to or facing the detection-objective portions, respectively. The detecting portions 48A to 48E are fixed, for example, to the barrel unit 12D disposed at the upper position as shown in FIG. 5. However, the detecting portions 48A to 48E may be fixed to an unillustrated adjusting column, etc., during the assembling and adjustment of the projection optical system PO. The angle θX of the mirror M shown in FIG. 6 is determined from the amount of difference between the results of detection of the pair of sensors 48A, 48B arranged on the left side as shown in FIG. 7. The angle θYZ of the mirror M shown in FIG. 6 is determined from the amount of difference between the results of detection of the pair of sensors 48A, 48C arranged in the X axis shown in FIG. 7. The driving amount in the Z direction and the angle of rotation about the Y axis of the mirror M are determined from the results of detection of the pair of sensors 48D, 48E arranged in the X axis at the upper end of the driving plate 34 shown in FIG. 7. Further, the driving amount in the Y direction of the mirror M is determined, for example, from the average value of the results of detection of the three sensors 48A to 48C. The driving amount of the mirror M can be regarded also as the amount of change of the relative position of the mirror M with respect to the mirror M4 shown in FIG. 5. As the sensor for detecting the driving amount of the mirror M, a magnetic type, optical type sensor or the like may be used instead of the capacitance type sensor.

With reference to FIG. 5 again, when the positions of the mirror M and the mirror M4 of the projection optical system PO of this embodiment are adjusted, for example, the position and the angle of the mirror M as a part of the illumination optical system are firstly adjusted by using the holding-adjusting mechanism 13M with respect to a target position and a target angle in relation to the reticle R shown in FIG. 1 or any other mirror of the illumination optical system 1, etc. For example, the optical axis of the mirror M is adjusted with respect to the optical axis of any other mirror constructing the illumination optical system. Since the illumination optical system and the projection optical system PO of this embodiment are the catoptric systems, it is also possible to use the visible light, etc. upon the adjustment. Next, upon performing the positional adjustment subsequently for the mirror M4 as the optical member included in the projection optical system PO, the position of the barrel unit 12C itself is sometimes adjusted by adjusting, for example, the thickness of the washer 14C shown in FIG. 4. In this case, the position and the angle of the mirror M as the part of the illumination optical system are consequently deviated or shifted from the target position and the target angle. Accordingly, the position and the angle of the mirror M are adjusted by the holding-adjusting mechanism 13M so that the amount of deviation of the mirror M, which is based on the amount of adjustment of the position of the barrel unit 12C, is offset. That is, by adjusting the relative position of the mirror M with respect to the mirror M4, the position and the angle of the mirror M are adjusted again to be at the target position and the target angle without changing the position of the mirror M. After that, if necessary, the position and the angle of the mirror M4 is finely adjusted by the holding-adjusting mechanism 13D to thereby make it possible to adjust the mirror M4 and the mirror M easily and quickly to be at the target positions respectively.

After that, the image formation characteristic of the projection optical system PO is measured, for example, by the test print performed by an operator periodically or before the start of the exposure using the exposure apparatus 10 shown in FIG. 1. Based on a result of the measurement of the image formation characteristic, the parallel link mechanisms 22 of the holding-adjusting mechanisms 13A to 13E shown in FIG. 4 may be driven by an unillustrated mirror controller to correct the wave aberration of the projection optical system PO or a predetermined image formation characteristic (for example, field curvature, astigmatism, coma aberration, spherical aberration, distortion aberration, etc.) as well. Accordingly, the exposure can be always performed highly accurately.

In this procedure, the EUV light beam, which has the extremely short wavelength, is used as the illumination light beam EL in the exposure apparatus 10; and the pattern of the reticle R is transferred onto the wafer W via the projection optical system PO of the catoptric system which does not involve any chromatic aberration. Therefore, a fine pattern on the reticle R can be transferred highly accurately to each of the shot areas on the wafer W. Specifically, it is possible to highly accurately transfer a fine pattern having a minimum line width of not more than about 70 nm.

In the embodiment described above, the mirror M4 included in the projection optical system PO and the mirror M included in the illumination optical system are arranged on the support plates 25C, 31 of the barrel unit 12C shown in FIG. 5. However, the present invention is also applicable, for example, when a plurality of mirrors included in the projection optical system PO and a plurality of mirrors included in the illumination optical system are arranged on the support plates 25C, 31. The embodiment described above is illustrative of the construction in which the mirror M4 and the mirror M are arranged on the support plates 25C, 31. However, the present invention is also applicable to such a construction that the mirror M4 and the mirror M are held separately from each other. The plurality of mirrors included in the illumination optical system may be arranged in a plurality of barrel units respectively. Further, the projection optical system PO of this embodiment is of the barrel unit system. However, the present invention is also applicable to a case in which the barrel unit system is not adopted.

When a semiconductor device is produced by using the exposure apparatus of the embodiment described above, the semiconductor device is produced by performing a step of designing the function and the performance of the device; a step of manufacturing a reticle based on the designing step; a step of forming a wafer from a silicon material; a step of performing the alignment by the exposure apparatus of the embodiment described above and exposing the wafer with a pattern of the reticle; a step of forming a circuit pattern by the etching, etc.; a step of assembling the device (including a dicing step, a bonding step, and a packaging step); an inspection step; and the like.

The embodiment described above is illustrative of the case in which the optical members are mirrors. However, the present invention is not limited to this. The optical member may be a lens. The embodiment described above is illustrative of the case in which the EUV light beam is used as the exposure light beam, and the all reflection type projection optical system constructed only of the six mirrors is used. However, this construction is an example. It is a matter of course that the present invention is not limited to this. That is, the present invention is also preferably applicable, for example, to an exposure apparatus provided with a projection optical system constructed only of four mirrors as disclosed in Japanese Patent Application Laid-open No. 11-345761 as a matter of course, as well as to a projection optical system having 4 to 8 mirrors in which a VUV light source having a wavelength of 100 to 160 nm, for example, an $Ar_2$ laser (wavelength: 126 nm) is used as a light source. The present invention is also preferably applicable to any one of a projection optical system of the dioptric system constructed only of a lens or lenses and a projection optical system of the catadioptric system partially including a lens or lenses.

The embodiment described above is illustrative of the case in which the EUV light beam having the wavelength of 11 nm is used as the exposure light beam. However, there is no limitation to this. A EUV light beam having a wavelength of 13 nm may be used as the exposure light beam. In this case, in order to secure the reflectance of about 70% with respect to the EUV light beam having the wavelength of 13 nm, it is necessary that a multilayer film, in which molybdenum Mo and silicon Si are alternately stacked, is used as the reflective film of each of the mirrors. In the embodiment described above, the laser-excited plasma light source is used as the exposure light source. However, there is no limitation to this. It is also allowable to use, for example, any one of a SOR (Synchrotron Orbital Radiation) ring, a betatron light source, a discharged light source, and an X-ray laser.

As described above, the present invention is not limited to the embodiment described above, and may be embodied in various forms within a range without deviating from the gist or essential characteristics of the present invention. The entire contents of disclosure of Japanese Patent Application No. 2006-020576, filed on Jan. 30, 2006, including the specification, claims, drawings, and abstract, are incorporated herein by reference.

All of the disclosures of the cited references, which relate, for example, to the exposure apparatus, are incorporated herein by reference within a range of permission of domestic laws and ordinances.

When the present invention is applied to the EUV exposure apparatus, for example, the optical member of the illumination optical system and the optical member of the projection optical system can be arranged in the same barrel in such a state that the relative positions can be easily adjusted. Therefore, it is easy to assemble and adjust the EUV exposure apparatus.

What is claimed is:

1. An optical member-holding apparatus which holds a plurality of optical members in a barrel, comprising:
    a first holding portion configured to hold a first optical member, of the plurality of optical members, which guides a light beam to a mask formed with a pattern;
    a second holding portion configured to hold a second optical member, of the plurality of optical members, into which the light beam is incident via the mask;
    a support base which is attached to the barrel and which supports the first holding portion and the second holding portion;
    an adjusting mechanism which is attached to the support base and which adjusts a relative position of the first holding portion to the second holding portion; and
    a position adjusting member which adjusts a position of the support base relative to the barrel;
    wherein after the position adjusting member has adjusted the position of the support base relative to the barrel, the adjusting mechanism adjusts the relative position of the first holding portion to the second holding portion.

2. The optical member-holding apparatus according to claim 1, wherein the adjusting mechanism has a first adjusting mechanism which adjusts a relative position of the first holding portion with respect to the support base, and a second adjusting mechanism which adjusts a relative position of the second holding portion with respect to the support base.

3. The optical member-holding apparatus according to claim 2, wherein an optical surface of the first optical member has a reflection surface which reflects an incident light beam; and
    the barrel has an opening which is provided at a portion, of the barrel, opposite to the reflection surface.

4. The optical member-holding apparatus according to claim 2, wherein the first adjusting mechanism has a first adjusting portion which moves the first holding portion in a radial direction with respect to a center of the barrel, a second adjusting portion which rotates the first holding portion about an axis parallel to a reflection surface of the first optical member, and a third adjusting portion which rotates the first holding portion about an optical axis of the first optical member.

5. The optical member-holding apparatus according to claim 4, further comprising a plurality of sensors which detect displacement of the first holding portion by the first adjusting portion, the second adjusting portion, and the third adjusting portion.

6. The optical member-holding apparatus according to claim 2, wherein the second adjusting mechanism moves the second optical member in a direction of an optical axis of the second optical member with respect to the support base; and
    the second adjusting mechanism inclines the second optical member with respect to the optical axis of the second optical member in relation to the support base.

7. The optical member-holding apparatus according to claim 1, wherein when the adjusting mechanism has adjusted a relative position of the second optical member with respect to the support base, the adjusting mechanism adjusts the position of the first optical member depending on the relative position of the second optical member.

8. The optical member-holding apparatus according to claim 1, wherein the first optical member is one of a plurality of optical members constructing a first optical system; and
    the second optical member is one of a plurality of optical members constructing a second optical system different from the first optical system.

9. The optical member-holding apparatus according to claim 8, wherein the first optical system includes an illumination optical system which illuminates the mask; and
    the second optical system includes a projection optical system which forms the pattern on a substrate.

10. An exposure apparatus which illuminates a mask with an exposure light beam via an optical member and exposes an object with the exposure light beam via the mask and a projection optical system constructed of a plurality of optical members,
    the exposure apparatus further comprising the optical member-holding apparatus as defined in claim 1, the optical member-holding apparatus holding the optical member and one optical member among the plurality of optical members, wherein the optical member is the first optical member of the plurality of optical members in the optical member-holding apparatus and the one optical member is the second optical member of the plurality of optical members in the optical member-holding apparatus.

11. The exposure apparatus according to claim 10, wherein a reflection type mask is used as the mask;
    all of the optical member illuminating the mask and the plurality of optical members constructing the projection optical system are mirrors; and
    a multilayer film is provided on a reflection surface of each of the mirrors to reflect an extreme ultraviolet light beam.

12. A method for producing a device by using a lithography step, the method comprising using the exposure apparatus as defined in claim 10 in the lithography step.

13. An exposure apparatus which illuminates a mask with an exposure light beam via a first optical system constructed of a plurality of optical members and exposes an object with the exposure light beam via the mask and a second optical system constructed of a plurality of optical members, the exposure apparatus further comprising the optical member-holding apparatus as defined in claim 1, the optical member-holding apparatus holding a first optical member among the plurality of optical members constructing the first optical system and a second optical member among the plurality of optical members constructing the second optical system, wherein the first optical member is the first optical member of the plurality of optical members in the optical member-holding apparatus and the second optical member is the second optical member of the plurality of optical members in the optical member-holding apparatus.

14. A method for producing a device by using a lithography step, the method comprising using the exposure apparatus as defined in claim 13 in the lithography step.

15. An optical member-holding apparatus comprising:
a first holding portion which holds a first optical member among a plurality of optical members constructing a first optical system;
a second holding portion which holds a second optical member among a plurality of optical members constructing a second optical system different from the first optical system;
a third holding portion which holds a third optical member among the plurality of optical members constructing the second optical system;
a first barrel unit which accommodates the first optical member via the first holding portion which accommodates the second optical member via the second holding portion;
a second barrel unit which accommodates the third optical member via the third holding portion;
a position adjusting member which is disposed between the first barrel unit and the second barrel unit and which adjusts a relative position of the third optical member to the first optical member; and
an adjusting mechanism which adjusts a relative position of the first optical member to the second optical member after the position adjusting member has adjusted the relative position of the third optical member to the first optical member.

16. The optical member-holding apparatus according to claim 15, wherein the first barrel unit has a support base which supports the first holding portion and the second holding portion; and
the adjusting mechanism is attached to the support base.

17. The optical member-holding apparatus according to claim 16, wherein the adjusting mechanism has a first adjusting mechanism which adjusts a relative position of the first holding portion with respect to the support base, and a second adjusting mechanism which adjusts a relative position of the second holding portion with respect to the support base.

18. The optical member-holding apparatus according to claim 17, wherein the first adjusting mechanism has a first adjusting portion which moves the first holding portion in a radial direction with respect to a center of the first barrel unit, a second adjusting portion which rotates the first holding portion about an axis parallel to a reflection surface of the first optical member, and a third adjusting portion which rotates the first holding portion about an optical axis of the first optical member.

19. The optical member-holding apparatus according to claim 18, further comprising a plurality of sensors which detect displacement of the first holding portion by the first adjusting portion, the second adjusting portion, and the third adjusting portion.

20. The optical member-holding apparatus according to claim 16, wherein the second adjusting mechanism moves the second optical member in a direction of an optical axis of the second optical member in relation to the support base; and the second adjusting mechanism inclines the second optical member with respect to the optical axis of the second optical member in relation to the support base.

21. An exposure apparatus which illuminates a mask with an exposure light beam via a first optical system constructed of a plurality of optical members and exposes an object with the exposure light beam via the mask and a second optical system constructed of a plurality of optical members,
the exposure apparatus further comprising the optical member-holding apparatus as defined in claim 15, the optical member-holding apparatus holding the first optical member among the plurality of optical members constructing the first optical system and the second optical member among the plurality of optical members constructing the second optical system.

22. A method for producing a device by using a lithography step, the method comprising using the exposure apparatus as defined in claim 21 in the lithography step.

23. A position-adjusting method for adjusting relative positions of a plurality of optical members, the method comprising:
adjusting a position of a support base relative to a barrel, the support base supporting a first optical member, among the plurality of optical members, which guides a light beam to a mask formed with a pattern and a second optical member, among the plurality of optical members, into which the light beam is incident via the mask; and
adjusting a position of the first optical member depending on a position of the second optical member on the support base, after the position of the support base has been adjusted relative to the barrel.

24. The position-adjusting method for the optical members according to claim 23, wherein the first optical member is one of a plurality of optical members constructing a first optical system; and
the second optical member is one of a plurality of optical members constructing a second optical system different from the first optical system.

25. The position-adjusting method for the optical members according to claim 24, wherein the first optical system includes an illumination optical system which illuminates the mask; and
the second optical system includes a projection optical system which forms the pattern on a substrate.

26. A position-adjusting method for adjusting positions of optical members, the method comprising:
accommodating, in a first barrel unit, a first optical member included in a plurality of optical members constructing a first optical system, and a second optical member included in a plurality of optical members constructing a second optical system different from the first optical system;
accommodating, in a second barrel unit, a third optical member included in the plurality of optical members constructing the second optical system;
adjusting a position of the third optical member relative to the first optical member by adjusting a relative position of the second barrel unit to the first barrel unit; and
adjusting a relative position of the first optical member to the second optical member after adjusting the position of the third optical member relative to the first optical member.

27. The position-adjusting method for the optical members according to claim 26, wherein the first optical system includes an illumination optical system which illuminates a mask formed with a pattern; and the second optical system includes a projection optical system which forms the pattern on a substrate.

* * * * *